United States Patent

Skokan

[15] 3,643,109

[45] Feb. 15, 1972

[54] LOGIC GATE

[72] Inventor: Zdenek E. Skokan, Mountain View, Calif.

[73] Assignee: Hewlett-Packard Company, Palo Alto, Calif.

[22] Filed: Oct. 9, 1970

[21] Appl. No.: 79,392

[52] U.S. Cl. ...............................307/235, 307/214, 307/215
[51] Int. Cl. .................H03k 5/00, H03k 19/34, H03k 19/36
[58] Field of Search .................................307/214, 215, 235

[56] References Cited

UNITED STATES PATENTS

| | | | |
|---|---|---|---|
| 2,986,652 | 5/1961 | Eachus | 307/215 |
| 2,862,171 | 11/1958 | Freeborn | 307/253 |
| 3,265,906 | 8/1966 | Feller | 307/214 |

*Primary Examiner*—John Zazworsky
*Attorney*—Roland I. Griffin

[57] ABSTRACT

The base of a common emitter connected transistor is connected to a threshold detector and the collector of the transistor is used as an input. When an applied voltage on the collector exceeds the threshold value, the threshold detector output is in a first state; and when the collector voltage is less than the threshold, the output is in a second state.

4 Claims, 3 Drawing Figures

INVENTOR
ZDENEK E. SKOKAN

LOGIC GATE

BACKGROUND AND SUMMARY OF THE INVENTION

Many common high-speed logic gates require a large amount of current, on the order of a few milliamperes, to drive the input. Since a piece of digital equipment may have hundreds or thousands of such gates, it is desirable to minimize the current demands of the logic gates. Also, many devices such as read/write and read only memories operate at low-current levels and thus require interfacing logic which operates at comparable levels.

The present invention utilizes a high-impedance input which sinks a small amount of current ($<50\ \mu A.$) in the high-logic state and negligible current in the low-logic state. In the high-logic state the current demand is independent of the applied voltage because the input transistor is operated as a current sink. The base of the transistor is connected to a threshold detector which clamps the voltage on the base to the threshold level whenever the voltage on the base reaches the threshold level. The current sunk by the input transistor is determined by the threshold voltage and a resistor in series with the emitter. The threshold detector provides a two level logic output to indicate whether or not the input transistor base has attained the threshold level.

DESCRIPTION OF THE PREFERRED EMBODIMENT

Figure 1:
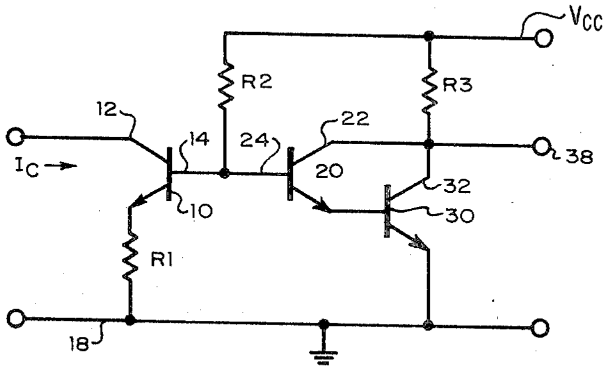
FIG. 1 shows a simplified schematic of a logic gate according to the present invention.

A simplified schematic of a high-speed logic gate constructed according to the present invention is shown in FIG. 1. Collector 12 of a transistor 10 provides the gate input. The emitter of transistor 10 is connected to common terminal 18 through resistor R1. Transistors 20 and 30 are connected in a Darlington configuration and base 24 is connected to base 14 with the emitter of transistor 30 to common terminal 18. Resistor R2 supplies bias current to bases 14 and 24 from a power supply $V_{cc}$. An output 38 is taken at the junction of collectors 22 and 32 and resistor R3 which connects the collectors to the power supply $V_{cc}$. The emitter of transistor 30 is connected to common terminal 18.

For the sake of example, assume that the transistors are silicon and that therefore the voltage drop across a forward biased base-emitter junction is about 0.7 volt. Also assume that $V_{cc}$ is 5 volts and define high to mean greater than 2.4 volts and low less than 0.8 volt, all voltages being measured with respect to common terminal 18. If collector 12 is held high, transistor 10 will be conducting as will transistors 20 and 30. Bases 14 and 24 will be at 1.4 volts because of the base-emitter drop through transistors 20 and 30. The current drawn by collector 12 will be essentially constant for any collector voltage above about 1 volt since the current $I_c$ flowing through transistor 10 is determined by resistor R1 and the voltage on base 14 minus the base-emitter voltage drop of transistor 10, i.e., $I_c$=0.7 volts/$R1$ ohms. Since transistor 30 is in saturation, output 38 will be low.

If collector 12 is held low, transistor 10 will stop conducting and current will flow from resistor R2 through transistor 10 and resistor R1 since the voltage drop across resistor R1 is set to be less than 0.7 volts. Therefore, transistors 20 and 30 will turn off and output 38 will go high. Transistors 20 and 30 act as a threshold detector with a threshold level of 1.4 volts, and they clamp base 14 to 1.4 volts when base 14 attains that level.

Figure 2:
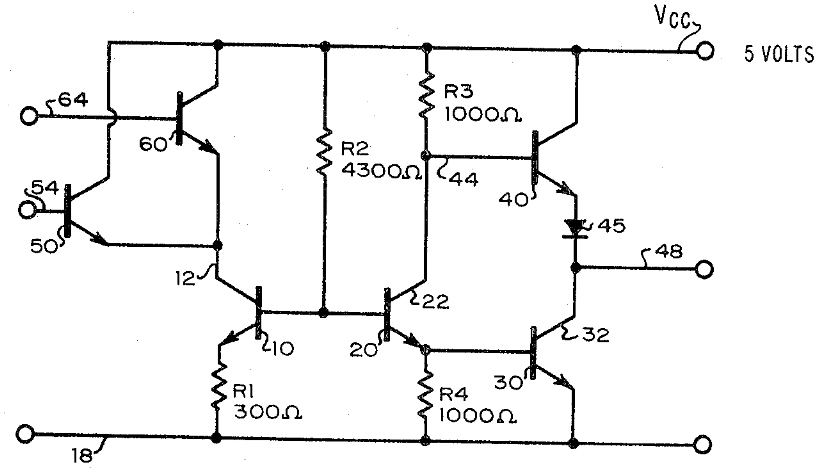
FIGS. 2 and 3 show examples of logic gates utilizing the present invention.

FIG. 2 shows a NOR-gate using the present invention. Transistors 50 and 60 are input amplifiers connected as emitter followers to collector 12. These input amplifiers reduce even further the input current required at inputs 54 and 64, while maintaining the constant input current feature of the basic gate described above. The emitters of transistors 50 and 60 are connected in parallel; therefore if either base 54 of 64 goes high, then transistors 10, 20 and 30 will turn on, making output 48 connected to collector 32 low. In the low state, transistor 30 will sink current through output 48. A transistor 40 has a base 44 connected to collector 22, and a collector to power supply $V_{cc}$. A diode 45 is in series with the emitter of transistor 40 and collector 32. When transistor 30 is on, transistor 40 is off and vice versa. Diode 45 helps ensure that collector 22 will pull base 44 low enough to keep transistor 40 off when transistors 20 and 30 are on. If both inputs 54 and 64 are low, then transistors 10, 20 and 30 are off and transistor 40 is on, making output 48 high and sourcing current to the load (not shown) on the gate output.

Figure 3:
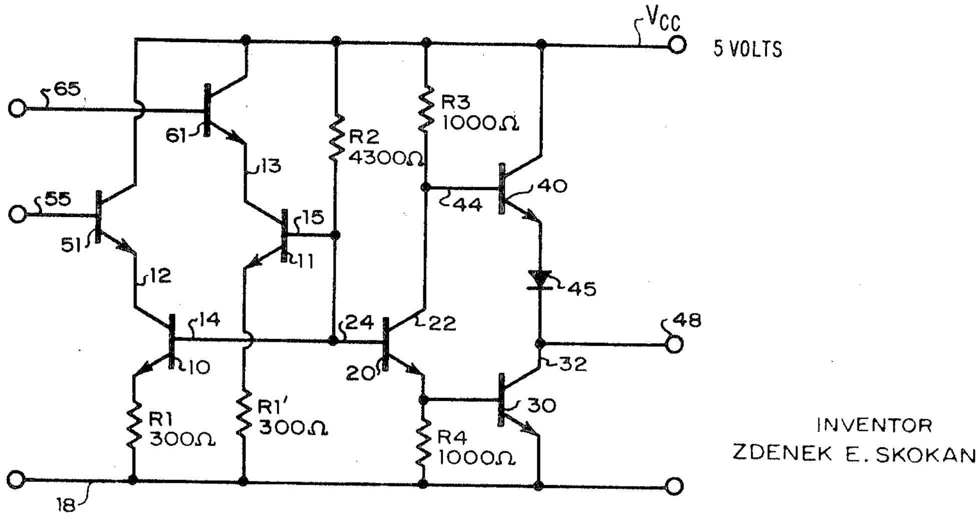

FIG. 3 shows a NAND-gate using the present invention. Each input 55 and 65 has a separate input amplifier 51 and 61 respectively and a separate input transistor 10 and 11 respectively. Transistors 10 and 11 are connected in parallel to base 24 and common 18. Thus, if one or both of the inputs 55 and 65 are low, the output 48 will be high, but if inputs 55 and 65 are both high, output 48 will be low. The component values shown and transistor types in FIGS. 2 and 3 are for illustrative purposes only; other component values and operating voltage levels can be used to realize an operable logic gate.

I claim:

1. A gating circuit comprising:
an input transistor having an emitter, a base and a collector;
input means connected to the collector for applying an input signal to the transistor;
a common terminal;
a resistive element connected in series with the emitter and the common terminal;
threshold detecting means having an input connected to the base for detecting the presence of a voltage between the base and common terminal substantially equal to a predetermined reference voltage, for providing an output indication in response thereto, and for preventing the voltage on the base from attaining a value greater than the reference voltage; and
output means connected to the threshold detecting means for giving an output signal in response to an indication therefrom.

2. A gating circuit in claim 1 wherein:
the input means comprises one or more transistors each having an emitter, a base, and a collector and each being connected in a common collector configuration;
each base serves as an input;
there are means for connecting each collector to receive power; and
each emitter is connected to the collector of said input transistor.

3. A gating circuit as in claim 1 including a plurality of said input transistors wherein:
the input means comprises an additional transistor corresponding to each input transistor, each additional transistor having an emitter, a base, and a collector and each being connected in a common collector configuration;
each base serves as an input;
there are means for connecting each collector to receive power; and
each emitter is connected to the collector of the corresponding one of said input transistors.

4. A gating circuit as in claim 1 wherein:
said threshold detecting means comprises a first and a second transistor each having an emitter, a base, and a collector, the base of the first transistor forming the threshold detecting means input;
the emitter of the first transistor is connected to the base of the second;
the emitter of the second transistor is connected to the common terminal; and
there are circuit means for connecting the collectors of both transistors to receive power, the output of said threshold detecting means being connected to the collector of one of said first and second transistors.